(12) United States Patent
Murota et al.

(10) Patent No.: US 9,870,924 B2
(45) Date of Patent: Jan. 16, 2018

(54) DIFFUSION AGENT COMPOSITION, METHOD OF FORMING IMPURITY DIFFUSION LAYER, AND SOLAR CELL

(75) Inventors: Atsushi Murota, Kawasaki (JP); Takaaki Hirai, Kawasaki (JP)

(73) Assignee: TOKYO OHKA KOGYO CO., LTD., Kawasaki-shi (JP)

( * ) Notice: Subject to any disclaimer, the term of this patent is extended or adjusted under 35 U.S.C. 154(b) by 865 days.

(21) Appl. No.: 13/696,907

(22) PCT Filed: Apr. 12, 2011

(86) PCT No.: PCT/JP2011/002147
§ 371 (c)(1),
(2), (4) Date: Nov. 8, 2012

(87) PCT Pub. No.: WO2011/145267
PCT Pub. Date: Nov. 24, 2011

(65) Prior Publication Data
US 2013/0061922 A1    Mar. 14, 2013

(30) Foreign Application Priority Data

May 17, 2010    (JP) ................ 2010-113536

(51) Int. Cl.
| | | |
|---|---|---|
| *H01L 21/22* | (2006.01) | |
| *H01L 31/0264* | (2006.01) | |
| *H01L 31/04* | (2014.01) | |
| *H01L 21/228* | (2006.01) | |
| *H01L 31/068* | (2012.01) | |
| *H01L 31/18* | (2006.01) | |
| *H01L 21/18* | (2006.01) | |

(52) U.S. Cl.
CPC ........ *H01L 21/2225* (2013.01); *H01L 21/228* (2013.01); *H01L 31/068* (2013.01); *H01L 31/1804* (2013.01); *H01L 21/18* (2013.01); *H01L 21/182* (2013.01); *Y02E 10/547* (2013.01); *Y02P 70/521* (2015.11)

(58) Field of Classification Search
None
See application file for complete search history.

(56) References Cited

U.S. PATENT DOCUMENTS 4,793,862 A    12/1988 Ishikawa et al.
2009/0239363 A1    9/2009 Leung et al.

FOREIGN PATENT DOCUMENTS

| | | |
|---|---|---|
| CN | 101132033 A | 2/2008 |
| JP | 09-181009 | 7/1997 |

(Continued)

OTHER PUBLICATIONS

NIST (http://webbook.nist.gov/cgi/cbook.cgi?ID=64-17-5&Type=IR-SPEC&Index=QUANT-IR,8[Jun. 25, 2015 1:36:49 PM]).*

(Continued)

*Primary Examiner* — Katie L Hammer
(74) *Attorney, Agent, or Firm* — Knobbe, Martens, Olson & Bear, LLP

(57) ABSTRACT

A diffusion agent composition used in forming an impurity diffusion agent layer on a semiconductor substrate, and containing an impurity diffusion component, a silicon compound, and a solvent containing a solvent having a boiling point of 100° C. or less, a solvent having a boiling point of 120-180° C., and a solvent having a boiling point of 300° C.

6 Claims, 2 Drawing Sheets

(56) References Cited

FOREIGN PATENT DOCUMENTS

| JP | A-2005-038997 | 2/2005 |
|---|---|---|
| JP | 2007-035719 | 2/2007 |
| JP | 2009-253145 | 10/2009 |
| TW | 200952049 A | 12/2009 |
| WO | WO 2009/120437 A1 | 10/2009 |

OTHER PUBLICATIONS

Sigma-Aldrich (http://www.sigmaaldrich.com/catalog/product/aldrich/484415?lang=en&region=US[Jun. 25, 2015 1:40:53 PM]).*
The Engineering Toolbox (http://www.engineeringtoolbox.com/glycerine-boiling-freezing-points-d_1590.html[Jun. 25, 2015 1:43:08 PM]).*
Office Action in European Application No. 11783206.3, dated Oct. 21, 2016.
Office Action dated Apr. 1, 2014 in Japanese Application No. 2010-113536.
International Search Report, dated Jul. 19, 2011, for International Application No. PCT/JP2011/002147.
International Preliminary Report on Patentability, dated Dec. 10, 2012, for International Application No. PCT/JP2011/002147.
Extended European Search Report dated Oct. 24, 2014 in European Patent Application No. 11783206.3.
Office Action in Taiwanese Patent Application No. 100114637, dated Aug. 27, 2015.
Office Action in Chinese Patent Application No. 201180019567.8, dated Oct. 14, 2014.
Office Action in Korean Patent Application No. 10-2012-7030239, dated Jan. 17, 2017.

* cited by examiner

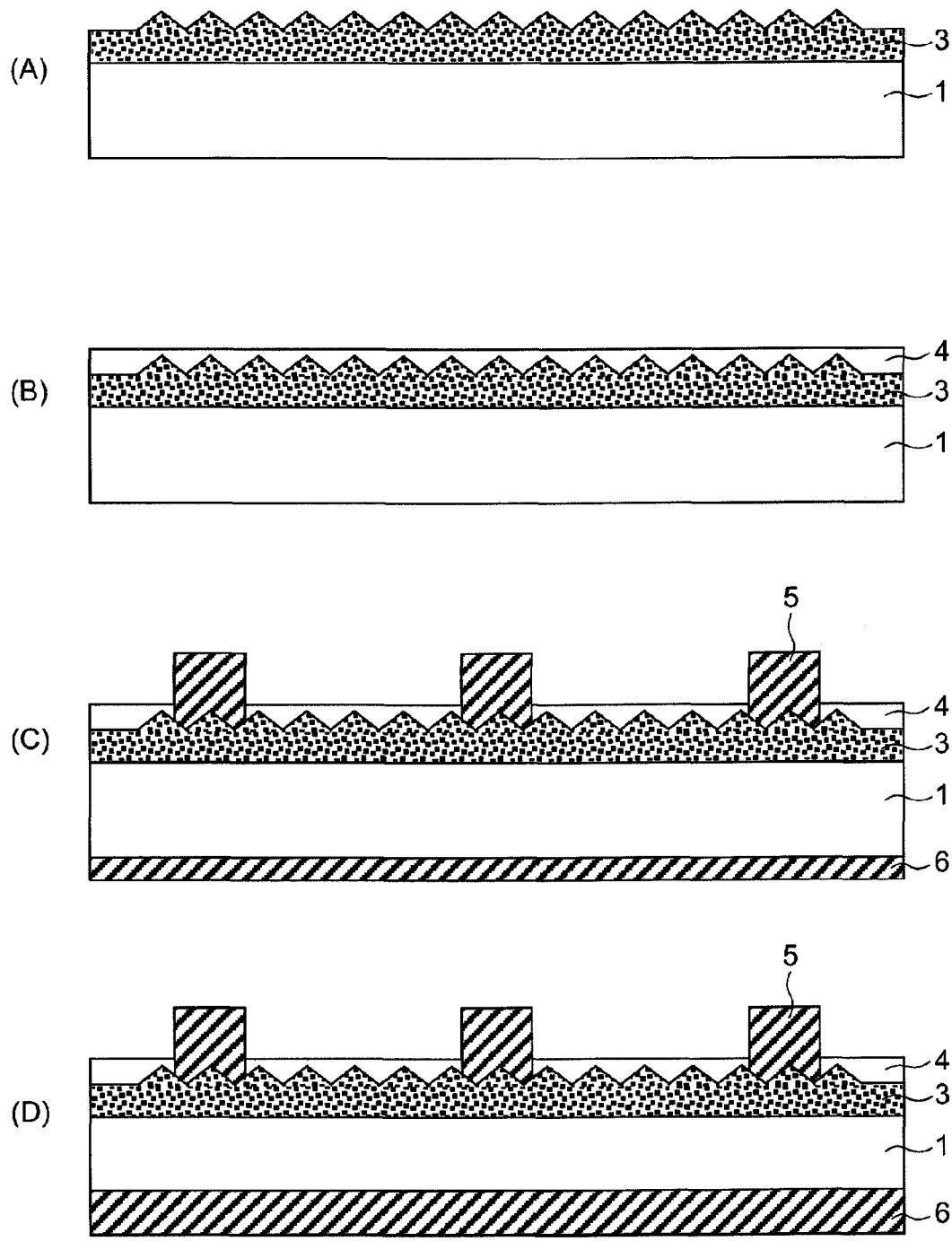

DIFFUSION AGENT COMPOSITION, METHOD OF FORMING IMPURITY DIFFUSION LAYER, AND SOLAR CELL

This application is the U.S. National Phase under 35 U.S.C. § 371 of International Application No. PCT/JP2011/002147, filed Apr. 12, 2011, designating the U.S., and published in Japanese as WO2011/145267 on Nov. 24, 2011, which claims priority to Japanese Patent Application No. 2010-113536, filed May 17, 2010, the entire content of which is incorporated herein by reference.

BACKGROUND OF THE INVENTION

1. Field of the Invention

The present invention relates to a diffusing agent composition, a method of forming an impurity diffusion layer, and a solar cell.

2. Description of the Related Art

In general, in manufacturing a solar cell, a P-type or N-type impurity diffusion layer is formed in a semiconductor substrate by applying a diffusing agent that contains a P-type or N-type impurity diffusion component to a surface of the semiconductor substrate and by causing the impurity diffusion component to diffuse from the applied diffusing agent.

A spin coating method is often used as a method for applying a diffusing agent on a surface of a semiconductor substrate. However, efforts have been also made toward employment of another method such as a screen printing method. In accordance with the efforts, there has been demand for diffusing agents that can be applied in various methods. For example, Patent document No. 1 discloses a coating liquid for boron diffusion (diffusing agent composition) for application in a screen printing method.

[Patent Document No. 1] JP 2007-35719

In general, a semiconductor substrate widely used in a solar cell is a silicon substrate, and fine concavities and convexities of approximately 2 μm, which are referred to as texture, are formed on the surface of the silicon substrate. Therefore, there is a possibility that application of diffusing agent compositions to the surface of a semiconductor substrate causes diffusing agent compositions on the convexities to flow in the concavities, leaving the convexities exposed. There is also a possibility that the diffusing agent compositions flowing in the concavities causes unevenness in the thickness of a layer of the diffusing agent compositions, creating cracks when the diffusing agent compositions shrink due to heating and/or lowering diffusion efficiency of the diffusing agent compositions due to floating of a layer of the diffusing agent compositions from the substrate. Therefore, diffusing agent compositions are required to be able to be applied evenly to the surface of a semiconductor substrate, i.e., required to have high coating film formability.

Efforts have been also made toward employment of a spray coating method as another method for applying a diffusing agent to the surface of a semiconductor substrate. Diffusing agent compositions for the application in a spray coating method are required to have a high coating film formability, which is a basic requirement for diffusing agent compositions, and are required not to cause the clogging of a spray nozzle, i.e., diffusing agent compositions are required to have a high discharge stability.

The present invention provides a diffusing agent composition that can be preferably employed for a spray coating method having an excellent coating film formability and discharge stability; a method of forming an impurity diffusion layer using the diffusing agent composition; and a solar cell.

One embodiment of the present invention relates to a diffusing agent composition, and the diffusing agent composition is used to form an impurity-diffusing agent layer on a semiconductor substrate and contains: an impurity-diffusing component (A); a silicon compound (B); and a solvent (C) containing a solvent (C1) having a boiling point of 100 degrees Celsius or less, a solvent (C2) having boiling point from 120 to 180 degrees Celsius, and a solvent (C3) having a boiling point from 240 to 300 degrees Celsius.

According to this embodiment, a diffusing agent composition can be obtained that has an excellent coating film formability and discharge stability and that can be preferably employed for a spray coating method.

Another embodiment of the present invention relates to a method of forming an impurity diffusion layer that includes: patterning a semiconductor substrate to form an impurity-diffusing agent layer of a predetermined pattern by printing the diffusing agent composition according to the above embodiment onto the semiconductor substrate by spray coating; and diffusing the impurity diffusion component (A) of the diffusing agent composition into the semiconductor substrate.

According to the embodiment, an impurity diffusion layer can be formed with higher accuracy.

Yet another embodiment of the present invention relates to a solar cell. The solar cell includes a semiconductor substrate in which an impurity diffusion layer is formed by the method of forming an impurity diffusion layer according to the above embodiment.

According to the embodiment, a more reliable solar cell can be obtained.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 2A through FIG. 2D are process sectional views for explaining a method of manufacturing a solar cell including a method of forming an impurity diffusion layer according to an embodiment of the invention.

Figure 1:
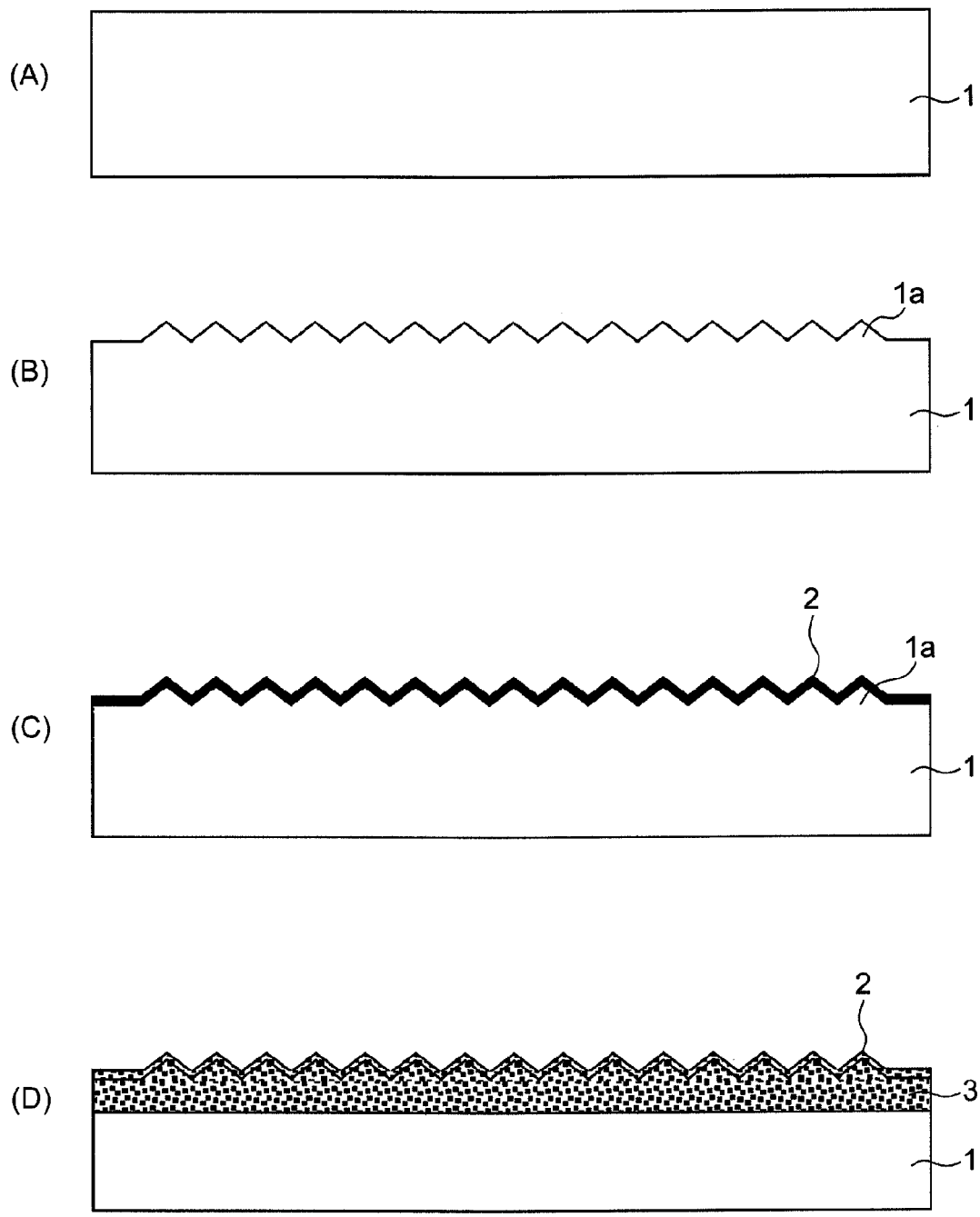
FIG. 1A through FIG. 1D are process sectional views for explaining a method of manufacturing a solar cell including a method of forming an impurity diffusion layer according to an embodiment of the invention.

Described below is an explanation of the present invention based on preferred embodiments. Reference herein to details of the illustrated embodiments is not intended to limit the scope of the claims. It should be understood that not all of the features and the combination thereof discussed are essential to the invention.

The diffusing agent composition according to the present embodiment is used to print an impurity-diffusing agent layer on a semiconductor substrate and preferably used to form an impurity-diffusing agent layer by spray coating.

The diffusing agent composition according to the present embodiment contains: an impurity-diffusing component (A); a silicon compound (B); and a solvent (C) containing a solvent (C1) having a boiling point of 100 degrees Celsius or less, a solvent (C2) having a boiling point from 120 to 180 degrees Celsius, and a solvent (C3) having a boiling point from 240 to 300 degrees Celsius. Each component of the diffusing agent composition according to the present embodiment is described in detail in the following.

<<Impurity-Diffusing Component (A)>>

The impurity-diffusing component (A) is a compound generally used as a dopant for manufacturing a solar cell. The impurity-diffusing component (A) is a P-type impurity-diffusing component containing a compound of a Group III (the Group 13) element or an N-type impurity-diffusing component containing a compound of a Group V (the Group 15) element. In the process of forming an electrode in a solar cell, a P-type or N-type impurity diffusion layer (impurity diffusion region) can be formed in a semiconductor substrate by using the impurity-diffusing component (A). In the process of forming an electrode in a solar cell, the P-type impurity-diffusing component containing a compound of a Group III element can form a P-type impurity diffusion layer in an N-type semiconductor substrate and a P$^+$-type (high concentration P-type) impurity diffusion layer in a P-type semiconductor substrate. Examples of the compound of a Group III element contained in the impurity-diffusing component (A) include, for example, $B_2O_3$, $Al_2O_3$, and the like, and the impurity-diffusing component (A) contains at least one kind of these compounds. In the process of forming an electrode in a solar cell, the N-type impurity-diffusing component containing a compound of a Group V element forms an N-type impurity diffusion layer in a P-type semiconductor substrate and an $N_+$-type (high concentration N-type) impurity diffusion layer in an N-type semiconductor substrate. Examples of the compound of a Group V element contained in the impurity-diffusing component (A) include, for example, $P_2O_5$, $Bi_2O_3$, $Sb(OCH_2CH_3)_3$, $SbCl_3$, $As(OC_4H_9)_3$, and the like.

The concentration of the impurity-diffusing component (A) is appropriately adjusted in accordance with the layer thickness, etc., of an impurity diffusion layer formed on the semiconductor substrate. For example, the impurity-diffusing component (A) is preferably contained in an amount of 0.1 percent by mass or greater with respect to the entire mass of the diffusing agent composition and more preferably in an amount of 1.0 percent by mass or greater.

The impurity-diffusing component (A) is preferably contained in an amount of 10 percent by mass or less with respect to the entire mass of the diffusing agent composition.

<<Silicon Compound (B)>>

The silicon compound (B) needs to be a conventionally-known compound used to form a silicon-based coating on a semiconductor substrate and is thus not particularly limited. Examples of the silicon compound (B) include, for example, at least one compound selected from a group consisting of $SiO_2$ fine particles and reaction products obtained by hydrolyzing alkoxysilane (hereinafter, the reaction products are referred to as hydrolysis products of alkoxysilane). An explanation is given in the following regarding the $SiO_2$ fine particles and regarding the hydrolysis products of alkoxylanes.

<<$SiO_2$ Fine Particles>>

Regarding the size of the $SiO_2$ fine particles, the average particle size is preferably 1 μm or less. If the average particle size exceeds 1 μm, there is a possibility that the diffusing agent composition is prevented from passing through a spray nozzle when applying the diffusing agent composition using a spray coating apparatus. Specific examples of the $SiO_2$ fine particles include fumed silica and the like.

<Hydrolysis Product of Alkoxysilane>

Alkoxysilane, a starting material for a hydrolysis product, is an Si-containing compound represented by the following general formula (1):

(where $R^1$ represents a hydrogen atom, alkyl group, or aryl group, $R^2$ represents an alkyl group or aryl group, and n represents an integer of 0, 1, or 2. When there are a plurality of $R^1$s, the plurality of $R^1$s may be the same as or different from one another. When there are a plurality of $(OR^2)$s, the plurality of $(OR^2)$s may be the same as or different from one another.)

When $R^1$ is an alkyl group, a linear or branched alkyl group having 1 to 20 carbon atoms is preferred, and a linear or branched alkyl group having 1 to 4 carbon atoms is more preferred. At least one $R^1$ is preferably an alkyl group or aryl group. The aryl group is, for example, a phenyl group.

When $R^2$ is an alkyl group, a linear or branched alkyl group having 1 to 5 carbon atoms is preferred, and an alkyl group having 1 to 3 carbon atoms is more preferred in terms of hydrolysis rate. It is preferred that n be 0. The aryl group is, for example, a phenyl group.

When n in the general formula (1) is 0, an alkoxysilane (i) is represented, for example, by the following general formula (2):

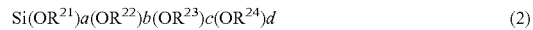

(where $R^{21}$, $R^{22}$, $R^{23}$, and $R^{24}$ each and independently represent the same alkyl group or aryl group as the above $R^2$, and a, b, c, and d are integers satisfying the following conditions: $0 \le a \le 4$, $0 \le b \le 4$, $0 \le c \le 4$, and $0 \le d \le 4$; and $a+b+c+d=4$.)

When n in the general formula (1) is 1, an alkoxysilane (ii) is represented, for example, by the following general formula (3):

(where $R^{31}$ represents the same hydrogen atom, alkyl group, or aryl group as the above $R^1$, where $R^{32}$, $R^{33}$, and $R^{34}$ each and independently represent the same alkyl group or aryl group as the above $R^2$, and where e, f, and g are integers satisfying conditions as follows: $0 \le e \le 3$, $0 \le f \le 3$; and $0 \le g \le 3$, and $e+f+g=3$)

When n in the general formula (1) is 2, an alkoxysilane (iii) is represented, for example, by the following general formula (4):

(where $R^{41}$ and $R^{42}$ each represent the same hydrogen atom, alkyl group, or aryl group as the above $R^1$ while at least one of $R^{41}$ and $R^{42}$ represents the alkyl group or aryl group, where $R^{43}$ and $R^{44}$ each and independently represent the same alkyl group or aryl group as the above $R^2$, and where h and i are integers satisfying conditions as follows: $0 \le h \le 2$; $0 \le i \le 2$; and $h+i=2$)

Specific examples of the alkoxysilane (i) include tetraalkoxysilanes such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane, etc. Among them, tetramethoxysilane and tetraethoxysilane are preferred.

Specific examples of the alkoxysilane (ii) include methyltrimethoxysilane, methyltriethoxysilane, methyltripropoxysilane, methyltripentyloxysilane, ethyltrimethoxysilane, ethyltripropoxysilane, ethyltripentyloxysilane, ethyltriphenyloxysilane, propyltrimethoxysilane, propyltriethoxysilane, propyltripentyloxysilane, propyltriphenyloxysilane, butyltrimethoxysilane, butyltriethoxysilane, butyltripropoxysilane, butyltripentyloxysilane, butyltriphenyloxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, butylmonomethoxymonoethoxymonobutoxysilane, etc. Among them, methyltrialkoxysilane (in particular, methyltrimetoxysilane, methyltriethoxysilane) is preferred.

Specific examples of the alkoxysilane (iii) include methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, etc. Among them, methyldimethoxysilane and methyldiethoxysilane are preferred.

An alkoxysilane used to obtain the above hydrolysis product can be appropriately selected from among the above alkoxysilanes (i)-(iii). As the alkoxysilane, the alkoxysilane (i) is particularly preferred. When using a mixture of these alkoxysilanes, a combination of the alkoxysilane (i) and the alkoxysilane (ii) is a more preferred combination. When using the alkoxysilane (i) and the alkoxysilane (ii), the alkoxysilanes are preferably used in a ratio of from 10 to 60 mole percent of the alkoxysilane (i) and from 90 to 40 mole percent of the alkoxysilane (ii) and are more preferably used in a ratio of from 15 to 50 mole percent of the alkoxysilane (i) and from 85 to 50 mole percent of the alkoxysilane (ii). Regarding the alkoxysilane (ii), R31 in the above general formula (3) is preferably an alkyl group or an aryl group and is more preferably an alkyl group.

The above hydrolysis product can be prepared by a method of hydrolyzing one or more alkoxysilanes selected from the above alkoxysilanes (i) to (iii) in the presence of an acid catalyst, water, and an organic solvent.

The acid catalyst may be an organic acid or an inorganic acid. Examples of the inorganic acid that can be used include sulfuric acid, phosphoric acid, nitric acid, and hydrochloric acid, etc. Among them, phosphoric acid and nitric acid are preferred. Examples of the organic acid include both carboxylic acids, such as formic acid, oxalic acid, fumaric acid, maleic acid, glacial acetic acid, acetic acid anhydride, propionic acid, and n-butyric acid, etc., and organic acids having a sulfur-containing acid residue. An example of the organic acids having a sulfur-containing acid residue includes an organic sulfonic acid, and examples of the esterificated compounds thereof include an organic sulfate ester and an organic sulfite ester, etc. Of these examples, an organic sulfonic acid, for example, a compound represented by the following general formula (5) is particularly preferred:

$$R^{13}-X \qquad (5)$$

(where $R^{13}$ is a hydrocarbon group that may have a substituent and where X is a sulfonic acid group.)

In the general formula (5), the hydrocarbon group represented as $R^{13}$ is preferably a hydrocarbon group having 1 to 20 carbon atoms. This hydrocarbon group may be a saturated or unsaturated group, and may be any one of linear, branched and cyclic groups. When the hydrocarbon group of $R^{13}$ is circular, aromatic hydrocarbon groups, for example, a phenyl group, a naphthyl group, and an anthryl group are preferred. Among them, a phenyl group is particularly preferred. One or more hydrocarbon groups having 1 to 20 carbon atoms may be bonded to the aromatic ring in the aromatic hydrocarbon group as a substituent group. The hydrocarbon group represented as the substituent on the aromatic ring may be a saturated or unsaturated group, and may be any one of linear, branched and cyclic groups. The hydrocarbon group represented as $R^{13}$ may have one or more substituents. Examples of the substituent include a halogen atom such as a fluorine atom, and a sulfonic acid group, a carboxyl group, a hydroxyl group, an amino group, a cyano group, and the like. As the organic sulfonic acid represented by the above general formula (5), nonafluorobutanesulfonic acid, methanesulfonic acid, trifluoromethanesulfonic acid, dodecylbenzenesulfonic acid, or mixtures thereof are particularly preferred in terms of an effect in improving the shape under the resist pattern.

The acid catalyst acts as a catalyst when the alkoxysilane is hydrolyzed in the presence of water. The amount of the acid catalyst that is used is preferably prepared such that the concentration thereof in the hydrolysis reaction system is in a range of from 1 to 1000 ppm and, in particular, in a range of from 5 to 800 ppm. The hydrolysis rate of a siloxane polymer changes in accordance with an addition amount of water. Thus, the addition amount of water is determined in accordance with the hydrolysis rate to be obtained.

Examples of the organic solvent in the hydrolysis reaction system include monohydric alcohol such as methanol, ethanol, propanol, isopropanol (IPA), and n-butanol; alkyl carboxylic esters such as methyl 3-methoxypropionate, and ethyl-3-ethoxypropionate; polyhydric alcohol such as ethylene glycol, diethylene glycol, propylene glycol, glycerin, trimethylolpropane, and hexanetriol; monoethers or monoacetates of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether; esters such as methyl acetate, ethyl acetate, and butyl acetate; ketones such as acetone, methyl ethyl ketone, and methyl isoamyl ketone; and polyhydric alcohol ethers in which all hydroxyl groups in polyhydric alcohol are alkyletherized, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These organic solvents may be used alone or in combination of two or more thereof.

In such a reaction system, the alkoxysilane is hydrolyzed to yield a siloxane polymer. The hydrolysis reaction is usually completed in a period of about 5 to 100 hours. In order to shorten the reaction period, it is preferred to heat the system in a temperature range of 80 degrees Celsius or less.

After the completion of the reaction, a reaction solution is yielded that contains the synthesized siloxane polymer and the organic solvent used for the reaction. The siloxane polymer can be obtained using a conventionally-known method by separating the siloxane polymer from the organic solvent and then by drying.

The amount of the silicon compound (B) to be blended in the diffusing agent composition according to the present embodiment is preferably 2 to 10 percent by mass in terms of $SiO_2$ based on the entire mass of the diffusing agent composition. By blending the silicon compound (B) in the above range, generation of cracks on a coating of the diffusing agent composition can be prevented, and an excellent impurity diffusion effect can be obtained.

<<Solvent (C)>>

A solvent (C) (solvent component) contains a solvent (C1) having a boiling point of 100 degrees Celsius or less, solvent (C2) having a boiling point of 120 to 180 degrees Celsius, and a solvent (C3) having a boiling point of 240 to 300 degrees Celsius. An explanation is given in the following regarding each of the solvents (C1) to (C3).

<Solvent (C1)>

A solvent (C1) is a solvent having a boiling point of 100 degrees Celsius or less and may be any solvent as long as the boiling point thereof under a normal pressure satisfies this condition. By containing a solvent (C1), the diffusing agent composition allows the impurity-diffusing component (A) to be dissolved in the diffusing agent composition and also allows the drying speed of the diffusing agent composition to become fast so that bleeding and/or broadening of a pattern caused after the application can be prevented. Specific examples of such a solvent (C1) include methanol (boiling point: 64.7 degrees Celsius), ethanol (boiling point: 78.4 degrees Celsius), ethyl acetate (boiling point: 77.1 degrees Celsius), methyl acetate (boiling point: 56.9 degrees Celsius), methyl ethyl ketone (boiling point: 79.5 degrees Celsius), acetone (boiling point: 56.5 degrees Celsius), and the like. These solvents may be used alone or in combination of two or more thereof. As a solvent (C1), ethanol is particularly preferred.

The solvent (C1) is preferably contained in an amount of 70 percent by mass or greater with respect to the entire mass of the solvent (C) of the diffusing agent composition and more preferably in an amount of 70 to 80 percent by mass. When the amount of the solvent (C1) is less than 70 percent by mass, there is a possibility that the impurity-diffusing component (A) of a desired amount cannot be dissolved. The solvent (C1) is preferably contained in an amount of 50 to 70 percent by mass with respect to the entire mass of the diffusing agent composition.

<Solvent (C2)>

A solvent (C2) is a solvent having a boiling point of 120 to 180 degrees Celsius, i.e., a solvent having a boiling point of 120 degrees Celsius or greater but 180 degrees Celsius or less and may be any solvent as long as the boiling point thereof under a normal pressure satisfies this condition. When the composition contains a solvent (C2), the coating film formability of the composition can be improved, preventing the generation of unevenness in an applied diffusing agent composition layer (impurity-diffusing agent layer) formed after the application. Specific examples of such a solvent (C2) include propylene glycol monomethyl ether (PGME) (boiling point: 120 degrees Celsius), propylene glycol monoethyl ether (boiling point: 132 degrees Celsius), propylene glycol monobutyl ether (boiling point: 170 degrees Celsius), propylene glycol monopropyl ether (boiling point: 150 degrees Celsius), 3-methoxy butyl acetate (boiling point: 171 degrees Celsius), and the like. Among these solvents, glycols are preferred since the viscosity of the solvents is suitable for use. These solvents may be used alone or in combination of two or more thereof.

The solvent (C2) is preferably contained in an amount of 10 percent by mass or greater with respect to the entire mass of the solvent components of the diffusing agent composition and more preferably in an amount of 10 to 20 percent by mass. When the solvent (C2) is contained in an amount of 10 percent by mass or greater, a sufficient effect of improving the coating film formability can be obtained. The solvent (C2) is preferably contained in an amount of 5 to 20 percent by mass with respect to the entire mass of the diffusing agent composition.

<Solvent (C3)>

A solvent (C3) is a solvent having a boiling point of 240 to 300 degrees Celsius, i.e., a solvent having a boiling point of 240 degrees Celsius or greater but 300 degrees Celsius or less and may be any solvent as long as the boiling point thereof under a normal pressure satisfies this condition. When the composition contains a solvent (C3), excessive drying of the diffusing agent composition can be avoided, thus preventing the clogging of a spray nozzle. As a result, the discharge stability of the diffusing agent composition is improved, allowing for the stable formation of an impurity-diffusing agent layer by a spray coating method. In addition, the impurity-diffusing performance increases when the solvent (C3) is added. It is assumed that this is caused due to a function of the solvent (C3) of reducing an impurity compound in the impurity-diffusing component (A). Specific examples of such a solvent (C3) include tripropylene glycol monomethyl ether (TPGM) (boiling point: 242 degrees Celsius), texanol (boiling point: 244 degrees Celsius), glycerin (boiling point: 290 degrees Celsius), triethylene glycol monobuthyl ether (boiling point: 271 degrees Celsius), and the like. Among these solvents, glycols are preferred since the viscosity of the solvents is suitable for use. These solvents may be used alone or in combination of two or more thereof.

The solvent (C3) is preferably contained in an amount of 10 percent by mass or greater with respect to the entire mass of the solvent components of the diffusing agent composition and more preferably in an amount of 10 to 20 percent by mass. When the solvent (C3) is contained in an amount of 10 percent by mass or greater, and a sufficient effect of improving the discharge stability can be obtained. The solvent (C3) is preferably contained in an amount of 5 to 20 percent by mass with respect to the entire mass of the diffusing agent composition.

<<Other Components (D)>>

The diffusing agent composition according to the present embodiment may contain a commonly-used surface-active agent, antifoaming agent, and the like as other components (D). When the composition contains a surface-active agent, the paintability, flattenability and developability of the composition can be improved, reducing the generation of unevenness in an applied diffusing agent composition layer formed after the application. Although a conventionally known surface-active agent can be used as such a surface-active agent, a silicone-based surface-active agent is preferred. In addition, the surface-active agent is preferably contained in an amount within a range of 500 to 3,000 ppm (parts per million) by mass, particularly 600 to 2,500 ppm by mass, based on the entire diffusing agent composition. Even more preferably, the surface-active agent is contained in an amount of 2,000 ppm by mass or less since the diffusing agent composition layer is excellent in detachability after a diffusion treatment is performed. The surface-active agent may be used alone or in combination.

As another component (D), a diffusing agent composition may contain an additive agent such as polypropylene glycol (PPG) or dipropylene glycol (DPG) serving as diffusion auxiliary agents for the impurity-diffusing component (A), or the like.

The concentration of metal impurities (other than metal components contained in the aforementioned impurity-diffusing component (A), the silicon compound (B), and the solvent (C)) contained in the diffusing agent composition according to the present embodiment is preferably 500 ppb (parts per billion) or less. Thereby, a drop in the efficiency of the photovoltaic effect, which is caused when metal impurities are contained, can be suppressed.

<<Method for Preparing Diffusing Agent Composition>>

The diffusing agent composition according to the present embodiment can be prepared by mixing the above-stated components in arbitrary order by a conventionally-known method in such a manner a homogeneous solution is prepared. The preparation is preferably performed so that the entire solid concentration becomes 6 percent by mass or less at this time. By using the diffusing agent composition with such solid concentration, a pattern formed after the discharging can be adjusted to have a proper thickness.

<<Method of Forming Impurity Diffusion Layer and Method of Manufacturing Solar Cell>>

In reference to FIGS. 1A through 2D, a detailed description will be made regarding a method of forming a P-type impurity diffusion layer on an N-type semiconductor substrate by using a spray coating method and regarding a method of manufacturing a solar cell provided with the semiconductor substrate on which the impurity diffusion layer is formed by the aforementioned method. FIG. 1A through FIG. 1D and FIG. 2A through FIG. 2D are process sectional views for explaining the method of manufacturing a solar cell including a method of forming an impurity diffusion layer according to an embodiment of the invention.

The method of forming an impurity diffusion layer according to the present embodiment comprises: a pattern forming step of forming an impurity-diffusing agent layer of a predetermined pattern by printing the above-described diffusing agent composition containing a P-type impurity-diffusing component (A) onto an N-type semiconductor substrate; and a diffusing step of diffusing the impurity-diffusing component (A) of the diffusing agent composition into the semiconductor substrate.

As shown in FIG. 1A, an N-type semiconductor substrate 1 such as a silicon substrate is prepared first. Next, as shown in FIG. 1B, a texture portion 1a having a fine relief structure is formed on one main surface of the semiconductor substrate 1 by a well-known wet etching method. The texture portion 1a prevents reflection of light on the surface of the semiconductor substrate 1. Then, as shown in FIG. 1C, a diffusing agent composition 2 containing a P-type impurity-diffusing component (A) as described above is applied onto the main surface of the semiconductor substrate 1 on the side of the texture portion 1a.

The diffusing agent composition 2 is applied onto the surface of the semiconductor substrate 1 by a spray coating method. In other words, the diffusing agent composition 2 is printed, using arbitrary spray coating apparatus, onto the surface of the semiconductor substrate by discharging the diffusing agent composition 2 through a spray nozzle of the spray coating apparatus so as to spray the diffusing agent composition 2 onto the surface of the semiconductor substrate 1. After an impurity-diffusing agent layer of a predetermined pattern is formed as described above, the applied diffusing agent composition 2 is dried by using a well-known means such as an oven.

Then, as described in FIG. 1D, the semiconductor substrate 1 on which the diffusing agent composition 2 is applied is placed inside an electric furnace and then burned. After the burning of the semiconductor substrate 1, the P-type impurity-diffusing component (A) in the diffusing agent composition 2 is allowed to diffuse into the semiconductor substrate 1 through the surface of the semiconductor substrate 1 in the electric furnace. Instead of an electric furnace, the semiconductor substrate 1 may be heated by commonly-used laser irradiation. In this way, the P-type impurity diffusion component (A) is diffused into the semiconductor substrate 1 to form a P-type impurity diffusion layer 3.

As shown in FIG. 2A, the diffusing agent composition 2 is then removed by a well-known etching method. Next, as shown in FIG. 2B, a passivation film 4 composed of a silicon nitride film (SiN film) is formed on the main surface of the semiconductor substrate 1 on the side of the texture portion 1a using a well-known chemical vapor deposition method (CVD method), e.g., a plasma CVD method. The passivation film 4 also functions as an antireflective film.

Next, as shown in FIG. 2C, patterning of a surface electrode 5 is formed on the main surface of the semiconductor substrate 1 on the side of the passivation film 4 by, for example, screen printing of a silver (Ag) paste. The surface electrode 5 is formed into a pattern to improve the efficiency of a solar cell. Also, a backside electrode 6 is formed on the other main surface of the semiconductor substrate 1 by, for example, screen printing of an aluminum (Al) paste.

Then, as shown in FIG. 2D, the semiconductor substrate 1 on which the backside electrode 6 is formed is, placed inside an electric furnace and burned, and aluminum forming the backside electrode 6 is then allowed to diffuse into the semiconductor substrate 1. This allows for the reduction in electrical resistance on the side of the backside electrode 6. A solar cell 10 according to the present embodiment can be manufactured by the above steps.

As explain above, the diffusing agent composition according to the present embodiment is a diffusing agent composition that is used for the formation of an impurity-diffusing agent layer on a semiconductor substrate and contains: the impurity-diffusing component (A); the silicon compound (B); and the solvent (C) containing the solvent (C1) having a boiling point of 100 degrees Celsius or less, the solvent (C2) having a boiling point from 120 to 180 degrees Celsius, and the solvent (C3) having a boiling point from 240 to 300 degrees Celsius. With this, the diffusing agent composition can have excellent coating film formability and discharge stability. With this, the diffusing agent composition can have excellent diffusing performance. Further, since the diffusing agent composition according to the present embodiment has excellent coating film formability and discharge stability, the diffusing agent composition can be suitably used for the formation of an impurity-diffusing agent layer by spray coating. When forming an impurity diffusion layer using the diffusing agent composition that is excellent in coating film formability, discharge stability, and diffusibility, the impurity diffusion layer can be formed with higher accuracy. Further, the use of the diffusing agent composition allows for the formation of an impurity diffusion layer with higher accuracy. Thus, the reliability of a solar cell including such an impurity diffusion layer can be improved.

These embodiments are intended to be illustrative only, and it will be obvious to those skilled in the art that various modifications could be developed based on the knowledge of a skilled person and that such modifications are also within the scope of the present invention. New embodiments resulting from combinations of the aforementioned embodiments and the following exemplary variations will provide the advantages of the embodiment and variations combined.

A diffusing agent composition according to the above-stated embodiment can be suitably employed for a spray coating method. However, the diffusing agent composition can be also employed for another printing method such as a spin-on method, an ink-jet printing method, a roll coat printing method, a screen printing method, a letterpress printing method, an intaglio printing method, and an offset printing method.

[Exemplary Embodiment]

The invention will now be described by reference to the preferred exemplary embodiments. This does not intend to limit the scope of the present invention, but to exemplify the invention.

<<Evaluation Test I. Evaluation on Coating Film Formability and Discharge Stability>>

Components and content ratios of respective diffusing agent compositions according to exemplary embodiments I-1 through I-4 and comparative examples I-1 through I-5 are shown in Table 1. A unit of each value in the table is percent by mass, and the ratio of each component is a ratio with respect to the entire mass of a corresponding diffusing agent composition. The content ratio of a silicon compound (B) represents a value obtained in terms of $SiO_2$.

TABLE 1

|  | SILICON COMPOUND (B) | IMPURITY-DIFFUSING | ADDITIVE | SOLVENT (C) | |
|---|---|---|---|---|---|
|  | TETRAETHOXYSILANE (IN TERMS OF $SiO_2$) | COMPONENT (A) $B_2O_3$ | AGENT (D) PPG | SOLVENT (C1) EtOH | SOLVENT (C2) PGME |
| EXEMPLARY EMBODIMENT I-1 | 8.10 | 1.90 | 7.00 | 66.40 | 8.30 |
| EXEMPLARY EMBODIMENT I-2 | 7.00 | 2.20 | 7.00 | 58.66 | 16.76 |
| EXEMPLARY EMBODIMENT I-3 | 7.00 | 2.20 | 7.00 | 58.66 | 8.38 |
| EXEMPLARY EMBODIMENT I-4 | 7.00 | 2.20 | 7.00 | 67.04 | 8.38 |
| COMPARATIVE EXAMPLE I-1 | 8.10 | 1.90 | 7.00 | 83.00 | — |
| COMPARATIVE EXAMPLE I-2 | 8.10 | 1.90 | 7.00 | 66.40 | — |
| COMPARATIVE EXAMPLE I-3 | 8.10 | 1.90 | 7.00 | 66.40 | 16.60 |
| COMPARATIVE EXAMPLE I-4 | 7.00 | 2.20 | 7.00 | 67.04 | 16.76 |
| COMPARATIVE EXAMPLE I-5 | 7.00 | 2.20 | 7.00 | 67.04 | — |

|  | SOLVENT (C) | | | CLOGGING OF NOZZLE | COATING FILM SHAPE |
|---|---|---|---|---|---|
|  | COMPARATIVE SOLVENT | SOLVENT (C3) | | | |
|  | HG | MFTG | TEXANOL | | |
| EXEMPLARY EMBODIMENT I-1 | — | 8.30 | — | ○ | ○ |
| EXEMPLARY EMBODIMENT I-2 | — | 8.38 | — | ○ | ○ |
| EXEMPLARY EMBODIMENT I-3 | — | 16.76 | — | ○ | ○ |

TABLE 1-continued

| | | | | | |
|---|---|---|---|---|---|
| EXEMPLARY EMBODIMENT I-4 | — | — | 8.38 | ○ | ○ |
| COMPARATIVE EXAMPLE I-1 | — | — | — | X | — |
| COMPARATIVE EXAMPLE I-2 | — | 16.60 | — | ○ | X |
| COMPARATIVE EXAMPLE I-3 | — | — | — | Δ | ○ |
| COMPARATIVE EXAMPLE I-4 | — | — | — | Δ | ○ |
| COMPARATIVE EXAMPLE I-5 | 8.38 | 8.38 | — | ○ | X |

Abbreviations shown in Table 1 represent the following compounds.

PPG: Polypropylene Glycol
EtOH: Ethanol
PGME: Propylene Glycol Monomethyl Ether
HG: Hexylene Glycol
MFTG: Methyl Propylene Triglycol (Exemplary Embodiment I-1)

<Preparation of Dopant Solution>

$B_2O_3$ acting as the impurity-diffusing component (A) was added in ethanol. The mixture was then heated and agitated for three hours in a hot-water bath of 60 degrees Celsius such that $B_2O_3$ was dissolved in the ethanol, thereby preparing a dopant solution. The dopant solution was prepared so that the concentration of $B_2O_3$ became 10 percent.

<Preparation of Original Coating Liquid>

Ethanol, tetraethoxysilane acting as the silicon compound (B), and concentrated hydrochloric acid were mixed to prepare an $SiO_2$ based coating liquid for forming a coated layer (original coating liquid).

<Preparation of Additive Agent Solution>

Polypropylene glycol (product name: Sunnix PP-4000, manufactured by Sanyo Chemical Industries, Ltd.) acting as the additive agent (D) was two-fold diluted with ethanol so as to prepare an ethanol solution (additive agent solution) having a polypropylene glycol concentration of 50 percent.

<Preparation of Diffusing Agent Composition>

The above-stated dopant solution, original coating liquid, and additive agent solution were mixed. A solvent (C) containing ethanol acting as the solvent (C1), propylene glycol monomethyl ether acting as the solvent (C2), and methyl propylene triglycol (manufactured by Nippon Nyukazai Co., Ltd., and corresponding to TPGM) acting as the solvent (C3) was added to the liquid mixture so as to prepare a diffusing agent composition. In the diffusing agent composition, the concentration of $SiO_2$ solid was 8.1 percent by mass, the concentration of $B_2O_3$ solid was 1.9 percent by mass, and the concentration of the additive agent was 7.0 percent by mass. The compositional ratios of the solvent (C) were as follows:

Solvent (C1):Solvent (C2):Solvent (C3)=8:1:1

(Exemplary Embodiment I-2)

In the same way as in the exemplary embodiment I-1, a diffusing agent composition was prepared. The concentration of $SiO_2$ solid was 7.0 percent by mass, and the concentration of $B_2O_3$ solid was 2.2 percent by mass. The compositional ratios of the solvent (C) were as follows:

Solvent (C1):Solvent (C2):Solvent (C3)=7:2:1

(Exemplary Embodiment I-3)

In the same way as in the exemplary embodiment I-1, a diffusing agent composition was prepared. The concentration of $SiO_2$ solid was 7.0 percent by mass, and the concentration of $B_2O_3$ solid was 2.2 percent by mass. Compositional ratios of the solvent (C) were as follows:

Solvent (C1):Solvent (C2):Solvent (C3)=7:1:2

(Exemplary Embodiment I-4)

In the same way as in the exemplary embodiment I-1, a diffusing agent composition was prepared. The concentration of $SiO_2$ solid was 7.0 percent by mass, and the concentration of $B_2O_3$ solid was 2.2 percent by mass. Instead of methyl propylene triglycol, texanol was used as the solvent (C3).

(Comparative Example I-1)

In the same way as in the exemplary embodiment I-1, a diffusing agent composition was prepared. As a composition of the solvent (C), only ethanol acting as the solvent (C1) was used.

(Comparative Example I-2)

In the same way as in the exemplary embodiment I-1, a diffusing agent composition was prepared. As the compositions of the solvent (C), ethanol acting as the solvent (C1) and methyl propylene triglycol acting as the solvent (C3) were used. The compositional ratios of the solvent (C) were as follows:

Solvent (C1):Solvent (C3)=8:2

(Comparative Example I-3)

In the same way as in the exemplary embodiment I-1, a diffusing agent composition was prepared. As the compositions of the solvent (C), ethanol acting as the solvent (C1) and propylene glycol monomethyl ether acting as the solvent (C2) were used. The compositional ratios of the solvent (C) were as follows:

Solvent (C1):Solvent (C2)=8:2

(Comparative Example I-4)

In the same way as in the exemplary embodiment I-1, a diffusing agent composition was prepared. The concentration of $SiO_2$ solid was 7.0 percent by mass, and the concentration of $B_2O_3$ solid was 2.2 percent by mass. As the compositions of the solvent (C), ethanol acting as the solvent (C1) and propylene glycol monomethyl ether acting as the solvent (C2) were used. The compositional ratios of the solvent (C) were as follows:

Solvent (C1):Solvent (C2)=8:2

(Comparative Example I-5)

In the same way as in the exemplary embodiment I-1, a diffusing agent composition was prepared. The concentration of $SiO_2$ solid was 7.0 percent by mass, and the concentration of $B_2O_3$ solid was 2.2 percent by mass. As the compositions of the solvent (C), ethanol acting as the solvent (C1), hexylene glycol (boiling point: 198 degrees Celsius) acting as a comparative solvent for the solvent (C2), and methyl propylene triglycol acting as the solvent (C3) were used. The compositional ratios of the solvent (C) were as follows:

Solvent (C1):Comparative Solvent:Solvent (C3)=8:1:1

<Observation of Nozzle Clogging and Coating Film Shape>

The diffusing agent compositions according to the respective exemplary embodiments and the diffusing agent compositions according to the respective comparative examples were each applied to an N-type semiconductor substrate by using a commonly-used spray coating apparatus. Conditions for the application are shown in the following. In other words, the application was performed using a two-fluid nozzle (SUJ1A, manufactured by Spraying Systems Co.) as a nozzle at a discharge rate of 0.1 g/min, an air flow rate of 20 L/min, and a scan speed of 400 mm/s. The temperature was 23 degrees Celsius, and the humidity was 40 percent. The clogging of the nozzle of the spray coating apparatus was observed, and the discharge stability of a diffusing agent composition was evaluated. When no generation of the crystallization of the diffusing agent composition was observed at the tip of the nozzle or when the amount of the crystallization generated was so small that it was assumed that long-term (e.g., one hour or longer) formation of a coating film was possible, "○" was entered. When generation of the crystallization of the diffusing agent composition was observed at the tip of the nozzle and it was assumed that long-term (e.g., one hour or longer) formation of a coating film was difficult, "Δ" was entered. When the formation of a coating film was impossible due to the generation of the crystallization, "x" was entered. Evaluation results are shown in Table 1. Based on experiments, etc., a skilled person in the art can appropriately set criteria for determining whether the long-term formation of a coating film is difficult.

After the formation of coating films of the respective diffusing agent compositions, the semiconductor substrates were placed on a hotplate and then went through a baking treatment for five minutes at 150 degrees Celsius. Cross sections of the semiconductor substrates and the respective coating films were imaged by using a SEM (Scanning Electron Microscope) so as to observe, in an SEM photographic image, the shape of the coating films formed on the surfaces of the respective semiconductor substrates. The coating film formability of the diffusing agent compositions was evaluated. When the entire surface of a semiconductor substrate was covered with a coating film of a corresponding diffusing agent composition, "○" was entered. When a part of the surface of a semiconductor substrate was exposed, "x" was entered. Evaluation results are shown in Table 1. A coating film was not formed due to the clogging of a nozzle in comparative example I-1. Thus, observation of the shape of a coating film was not performed.

<Evaluation>

As shown in Table 1, a discharge stability was extremely low in comparative example I-1 where a solvent (C2) and a solvent (C3) were not included. Therefore, a coating film was not formed (i.e., the coating film formability was also low). In comparative examples I-2 and I-5 where a solvent (C2) was not included, the coating film formability was also low. In comparative examples I-3 and I-4 where a solvent (C3) was not included, the discharge stability was low. On the other hand, it was confirmed that all the exemplary embodiments where a solvent (C1), a solvent (C2), and a solvent (C3) were included have a good discharge stability and a good coating film formability.

In comparison to the coating film formability of comparative examples I-2 and I-5 where a solvent (C1) and a solvent (C3), but not a solvent (C2), were included, the coating film formability was improved in the exemplary embodiments where a solvent (C1), a solvent (C2), and a solvent (C3) were included. Thus, it is predicted that a solvent (C2) contributes to the improvement in the coating film formability. This can be also predicted based on a fact that the coating film formability was improved in comparative examples I-3 and I-4 where a solvent (C2), but not a solvent (C3), was included in comparison to that of comparative example I-1 where a solvent (C2) and a solvent (C3) were not included and in comparison to that of comparative examples I-2 and I-5 where a solvent (C3), but not a solvent (C2), was included.

The discharge stability was improved in the exemplary embodiments where a solvent (C1), a solvent (C2), and a solvent (C3) were included in comparison to that of comparative examples I-3 and I-4 where a solvent (C1) and a solvent (C2), but not a solvent (C3), were included. Thus, it is predicted that a solvent (C3) contributes to the improvement in the discharge stability. This can be also predicted based on a fact that the discharge stability was improved in comparative examples I-2 and I-5 where a solvent (C3), but not a solvent (C2), was included in comparison to that of comparative example I-1 where a solvent (C2) and a solvent (C3) were not included and in comparison to that of comparative examples I-3 and I-4 where a solvent (C2), but not a solvent (C3), was included.

<<Evaluation Test II. Evaluation on Diffusibility>>

A diffusing agent composition is required to be able to diffuse evenly throughout a predetermined region of a semiconductor substrate so as to lower a resistance value of a diffusion region to a desired value, i.e., required to have high diffusibility. The diffusibility of a diffusing agent composition according to the present embodiment is evaluated. Components and content ratios of respective diffusing agent compositions according to exemplary embodiments II-1 through II-4 and a comparative example II-1 are shown in Table 2. A unit of each value in the table is percent by mass, and the ratio of each component represents a ratio with respect to the entire mass of a corresponding diffusing agent composition. The content ratio of a silicon compound (B) represents a value obtained in terms of $SiO_2$. Abbreviations shown in Table 2 are the same as those shown in Table 1.

TABLE 2

| | SILICON COMPOUND (B) TETRAETHOXYSILANE (IN TERMS OF $SiO_2$) | IMPURITY-DIFFUSING COMPONENT (A) $B_2O_3$ | ADDITIVE AGENT (D) PPG | SOLVENT (C) SOLVENT (C1) EtOH | SOLVENT (C2) PGME |
|---|---|---|---|---|---|
| EXEMPLARY EMBODIMENT II-1 | 7.00 | 2.20 | 7.00 | 58.66 | 16.76 |
| EXEMPLARY EMBODIMENT II-2 | 7.00 | 2.20 | 7.00 | 58.66 | 8.38 |

TABLE 2-continued

| | | | | | |
|---|---|---|---|---|---|
| EXEMPLARY EMBODIMENT II-3 | 7.00 | 2.20 | 7.00 | 67.04 | 8.38 |
| EXEMPLARY EMBODIMENT II-4 | 7.00 | 2.20 | 7.00 | 67.04 | 8.38 |
| COMPARATIVE EXAMPLE II-1 | 7.00 | 2.20 | 7.00 | 67.04 | 16.76 |

| | SOLVENT (C) SOLVENT (C3) | | | SHEET RESISTANCE VALUE |
|---|---|---|---|---|
| | MFTG | TXANOL | GLYCERIN | (Ω/sq.) |
| EXEMPLARY EMBODIMENT II-1 | 8.38 | — | — | 140 |
| EXEMPLARY EMBODIMENT II-2 | 16.76 | — | — | 120 |
| EXEMPLARY EMBODIMENT II-3 | — | 8.38 | — | 83 |
| EXEMPLARY EMBODIMENT II-4 | — | — | 8.38 | 36 |
| COMPARATIVE EXAMPLE II-1 | — | — | — | 170 |

(Exemplary Embodiment II-1)

In the same way as in the exemplary embodiment I-1, a diffusing agent composition was prepared. The concentration of $SiO_2$ solid was 7.0 percent by mass, and the concentration of $B_2O_3$ solid was 2.2 percent by mass. The compositional ratios of the solvent (C) were as follows:

Solvent (C1):Solvent (C2):Solvent (C3)=7:2:1

(Exemplary Embodiment II-2)

In the same way as in the exemplary embodiment II-1, diffusing agent composition was prepared. The compositional ratios of the solvent (C) were as follows:

Solvent (C1):Solvent (C2):Solvent (C3)=7:1:2

(Exemplary Embodiment II-3)

In the same way as in the exemplary embodiment II-1, a diffusing agent composition was prepared. Instead of methyl propylene triglycol, texanol was used as the solvent (C3). The compositional ratios of the solvent (C) were as follows:

Solvent (C1):Solvent (C2):Solvent (C3)=8:1:1

(Exemplary Embodiment II-4)

In the same way as in the exemplary embodiment II-1, diffusing agent composition was prepared. Instead of methyl propylene triglycol, glycerin was used as the solvent (C3). The compositional ratios of the solvent (C) were as follows:

Solvent (C1):Solvent (C2):Solvent (C3)=8:1:1

(Comparative Example II-1)

In the same way as in the exemplary embodiment II-1, a diffusing agent composition was prepared. The compositions of the solvent (C) included ethanol acting as the solvent (C1) and propylene glycol monomethyl ether acting as the solvent (C2). The compositional ratios of the solvent (C) were as follows:

Solvent (C1):Solvent (C2)=8:2

<Measurement of Sheet Resistance Values>

In the same way as in Evaluation Test I, respective diffusing agent compositions according to the exemplary embodiments and the comparative examples were applied onto the surfaces of respective N-type semiconductor substrates by spray coating. The semiconductor substrates were then placed on a hotplate and went through a baking treatment for five minutes at 150 degrees Celsius. The semiconductor substrates were then placed inside an electric furnace and burned for 30 minutes at 600 degrees Celsius in an $O_2$ atmosphere. The semiconductor substrates were then heated for 30 minutes at 1000 degrees Celsius in an $N_2$ atmosphere so as to allow the respective impurity-diffusing components (A) to diffuse thermally. The semiconductor substrates were immersed in an HF solution of 50 percent concentration for one minute so as to peel off oxide films formed on the surfaces of the semiconductor substrates due to the thermal diffusion. The sheet resistance values of impurity diffusion layers formed in the respective semiconductor substrates were measured based on a four-point probe method using a sheet resistance meter (VR-70 manufactured by Kokusai Electric Co., Ltd.). Measurement results of sheet resistance values (Ω/sq.) are shown in Table 2.

<Evaluation>

As shown in Table 2, all the exemplary embodiments showed sheet resistance values that were lower than that of comparative example II-1. Based on the comparison between exemplary embodiment II-1 and exemplary embodiment II-2, it is predicted that a sheet resistance value can be further lowered when the contained amount of a solvent (C3) is larger than that of a solvent (C2).

The invention claimed is:

1. A diffusing agent composition used to form an impurity-diffusing agent layer on a semiconductor substrate, comprising:
    an impurity diffusion component (A);
    a silicon compound (B); and
    a solvent (C) including a solvent (C1) having a boiling point of 100 degrees Celsius or less, a solvent (C2) having a boiling point of 120 to 180 degrees Celsius, and a solvent (C3) having a boiling point of 240 to 300 degrees Celsius, wherein
    the solvent (C1) is contained in an amount of 70 percent by mass or greater with respect to the entire mass of solvent components of the diffusing agent composition, wherein the solvent (C2) is contained in an amount of 10 percent by mass or greater with respect to the entire mass of the solvent components of the diffusing agent composition, and wherein the solvent (C3) is contained in an amount of 10 percent by mass or greater with respect to the entire mass of the solvent components of the diffusing agent composition.

2. The diffusing agent composition according to claim 1 wherein the impurity-diffusing component (A) contains a compound of a Group III element or a compound of a Group V element.

3. The diffusing agent composition according to claim 1, wherein the solvent (C2) and the solvent (C3) are glycols.

4. The diffusing agent composition according to claim 1, wherein the silicon compound (B) is at least one compound selected from the group consisting of $SiO_2$ fine particles and reaction products obtained by hydrolyzing an alkoxysilane represented by the following general formula (1):

$$R^1_n Si(OR^2)_{4-n} \tag{1}$$

wherein $R^1$ represents a hydrogen atom, an alkyl group, or an aryl group, $R^2$ represents an alkyl group or an aryl group, and n represents an integer of 0, 1, or 2; wherein when there are a plurality of $R^1$s, the plurality of $R^1$s may be the same or different; and when there are a plurality of $(OR^2)$s, the plurality of $(OR^2)$s may be the same or different.

5. A method of forming an impurity diffusion layer, comprising:
   patterning a semiconductor substrate to form an impurity-diffusing agent layer of a predetermined pattern by printing the diffusing agent composition according to claim 1 onto the semiconductor substrate by spray coating; and
   diffusing the impurity diffusion component (A) of the diffusing agent composition into the semiconductor substrate.

6. An impurity-diffusing agent layer comprising the diffusing agent composition according to claim 1 spray coated on a substrate.

* * * * *